United States Patent [19]
Wakabayashi et al.

[11] Patent Number: 5,585,687
[45] Date of Patent: Dec. 17, 1996

[54] PIEZOLELECTRIC OSCILLATOR

[75] Inventors: Hisao Wakabayashi, Tokorozawa; Toshinori Ide; Toshihide Ooi, both of Saku; Takeshi Murata, Ueda; Shinji Nakayama, Kitasaku; Toshimitsu Aruga, Chiisagata, all of Japan

[73] Assignees: Citizen Watch Co., Ltd.; Miyota Co., Ltd.; Cimeo Precision Co., Ltd.

[21] Appl. No.: 391,589

[22] Filed: Feb. 21, 1995

[30] Foreign Application Priority Data

Feb. 23, 1994 [JP] Japan .................................. 6-047929
Jun. 24, 1994 [JP] Japan .................................. 6-164851

[51] Int. Cl.[6] .................................................. H01L 41/08
[52] U.S. Cl. .................... 310/366; 310/344; 310/348; 310/353; 310/367
[58] Field of Search .................................. 310/344, 348, 310/353, 366, 367

[56] References Cited

U.S. PATENT DOCUMENTS

| | | | |
|---|---|---|---|
| 4,571,794 | 2/1986 | Nakamura | 29/25.35 |
| 5,192,925 | 3/1993 | Kaida | 310/367 |
| 5,357,662 | 10/1994 | Takagi et al. | 310/340 |

FOREIGN PATENT DOCUMENTS

| | | | |
|---|---|---|---|
| 0203312 | 12/1982 | Japan | 310/340 |
| 0181713 | 10/1984 | Japan | 310/348 |
| 0034713 | 2/1991 | Japan | 310/344 |
| 4-298109 | 10/1992 | Japan | H03H 9/05 |
| 4-367111 | 12/1992 | Japan | H03H 9/09 |
| 2067009 | 7/1981 | United Kingdom | 310/344 |

*Primary Examiner*—Thomas M. Dougherty
*Attorney, Agent, or Firm*—Dickstein Shapiro Morin & Oshinsky LLP

[57] ABSTRACT

A piezoelectric oscillator comprises a piezoelectric oscillating reed, an insulating substrate for retaining the piezoelectric oscillating reed, and a cap fixed onto the top surface of the insulating substrate for enclosing the piezoelectric oscillating reed. Four connecting electrodes are formed on the top surface of the insulating substrate for electrical connection to the oscillating reed, which are divided into two groups. Each group includes two connecting electrodes which are connected to each other by metal interconnects. The insulating substrate is rectangular, and two connecting electrodes, each of which belong to one group, are located along the shorter sides of the insulating substrate. On the bottom surface of the insulating substrate, at least two external electrodes are formed, to which metal interconnects for each group are connected through the side surface of the insulating substrate.

20 Claims, 16 Drawing Sheets

PIEZOLELECTRIC OSCILLATOR

BACKGROUND OF THE INVENTION

1. Field of the Invention

This invention relates to a piezoelectric oscillator, and more particularly to a surface-mounted type piezoelectric oscillator.

2. Discussion of the Related Art

A piezoelectric oscillator, such as a quartz oscillator, has been used as a clock source for a micro computer, communications equipment, and so on, and especially in recent years, a surface-mounted type piezoelectric oscillator has been employed, in view of a easy mounting on a printed-wiring substrate. For example, JP Laid Open H4-367111 discloses a surface-mounted type piezoelectric oscillator, where a piezoelectric vibrating reed is supported by a pair of carriers which are brazed onto metal interconnects provided on a substrate. Such an oscillator comprises many parts and is unsuitable for miniaturization. Further, vibration of the oscillator is limited by the twin-carrier structure, which adversely affects the properties of the oscillator in proportion to the miniaturization.

On the other hand, JP Laid Open H4-298109 discloses a cantilevered oscillator, where a quartz oscillating reed is fixed by conductive adhesive on an attaching member having an electrode thereon for electrical connection, thereby ensuring conductivity with the oscillating reed. Such a cantilevered oscillator is superior to a twin-supported oscillator in both properties and structural simplicity, and can be made smaller and thinner.

However, in such a surface-mounted type piezoelectric oscillator having a cantilevered oscillating reed structure, a lead electrode of the oscillating reed generally extends toward only one end of the reed. For this reason, the end portion of the oscillating reed where the lead electrode exists must be precisely overlaid on the connecting electrode provided on the substrate to ensure the electrical conductivity. When the oscillating reed is placed in the reversed direction, the lead electrode does not meet the connecting electrode on the substrate, and conductivity is not obtained. Therefore, during the mounting of the oscillating reed, the direction of the oscillating reed must be confirmed so as to ensure the conductivity. When the oscillating reed is mounted in the reversed direction by mistake, it must be remounted. Thus, the mounting process of the oscillating reed is troublesome, and automation or mechanization is difficult.

SUMMARY OF THE INVENTION

This invention aims to provide a piezoelectric oscillator comprising a substrate which enables conductive connection with an oscillating reed having an electrode extending to only one end, irrespective of the direction of the oscillating reed.

It is another object of the invention to provide a piezoelectric oscillator, in which binding between the cap and an insulating substrate is ensured.

In order to achieve the objects, in one aspect of the invention, a piezoelectric oscillator is provided which comprises a piezoelectric oscillating reed, an insulating substrate for mounting the piezoelectric oscillating reed, and a cap bound to the top surface of the insulating substrate for housing the oscillating reed. On the top surface of the insulating substrate, at least four connecting electrodes are provided for electrical connection with the piezoelectric oscillating reed, which are divided into two groups, the connecting electrodes included in the same group being connected to each other via metals interconnect on the insulating substrate.

Because of the interconnection between the connecting electrodes in the same group, any one of the connecting electrodes in a group can be selected for electrical connection with the piezoelectric oscillating reed. Thus, even when the oscillating reed is of cantilevered type and has a lead electrode on only one end, electrical connection between the piezoelectric oscillating reed and the connecting electrode on the insulating substrate is ensured without confirming the placing direction of the oscillating reed. With this structure, working efficiency is improved and reduced cost is realized.

The metal interconnects are formed on the insulating substrate so as not to overlap each other, thereby enabling them to be formed simultaneously by, for example, metalizing.

Preferably, the insulating substrate is a rectangular plate, and the connecting electrodes formed on the substrate are divided into two groups by a longitudinal axis of the substrate. Two electrodes, each of which belongs to a different group, are arranged along a shorter side of the rectangular plate so as to be opposed to each other, and the same is done along the other shorter side.

Since the piezoelectric oscillating reed is generally of a rectangular shape and has a lead electrode for electrical connection on one end portion thereof, the forming of the connecting electrodes on each corner of the insulating substrate enables reliable connection between the piezoelectric oscillating reed and a connecting electrode on the insulating substrate.

On the bottom surface of the insulating substrate, at least two external electrodes are provided, to each of which the metal interconnect of each group is connected via the side surface of the insulating substrate. With this structure, the piezoelectric oscillator can be surface-to-surface mounted onto a printed substrate, by making practical use of the bottom electrodes.

Both the connecting electrodes and metal interconnects are arranged in point symmetry about the center point of the insulating substrate, and each group is arranged in line symmetry about the longitudinal axis of the substrate.

With this arrangement, capacitance generated by any of the connecting electrodes and metal interconnects becomes equal irrespective of the direction of the piezoelectric oscillating reed, thereby obtaining excellent electrical characteristics.

Two connecting electrodes arranged along a shorter side of the oscillating reed, each belonging to one group, are opposed to each other via a separation groove for ensuring the separation of the two electrodes.

The cap is preferably fixed by an adhesive onto the periphery of the top surface of the insulating substrate. The end surface of the side walls of the cap, which is to be fixed to the top surface of the substrate, is preferably chamfered to increase the adhering area to ensure a sufficient binding strength. The thickness of the side walls of the cap is made uniform, especially at the end portion thereof, over the full length.

Generally, in a conventional rectangular shaped cap, the thickness of the corner portions is greater than the other portions, and adhesive is apt to concentrate at the larger corner area. In order to avoid the concentration of adhesive, the thickness of the side wall of the cap (i.e. width of the end surface) is made uniform at any portion.

The inner and outer edges of the end surface of the cap are chamfered with the same radius of curvature, thereby storing a sufficient amount of adhesive at both side of the side wall.

The periphery of the top surface of the insulating substrate, to which the cap is attached, is covered with a protecting layer made of insulating material. Accordingly, the cap is fixed onto the metal interconnects and connecting electrodes via the protecting layer.

BRIEF DESCRIPTION OF DRAWINGS

FIG. 1A shows a cap, FIG. 1B shows a piezoelectric oscillating reed, and FIG. 1C shows a substrate.

FIG. 2A is a top view, FIG. 2B is a side view, and FIG. 2C is a bottom view.

FIG. 3A illustrates an example in which the oscillating reed is placed in a direction where first and fourth connecting electrodes are used for electrical connection, while FIG. 3B illustrates an example in which the oscillating reed is placed in a different direction where second and third connecting electrodes are used.

FIG. 5A shows a top side and FIG. 5B shows a bottom side of the substrate.

FIG. 6A shows a top side and FIG. 6B shows a bottom side.

FIG. 9A shows a cap, FIG. 9B shows a piezoelectric oscillating reed, and FIG. 9C shows a substrate.

FIG. 11A shows a cap, FIG. 11B shows a piezoelectric oscillating reed, and FIG. 11C shows a substrate.

FIG. 12A is a bottom view, FIG. 12B is a cross-sectional view along the X-Y-Z line, and FIG. 12C is an enlarged view of the portion D shown in FIG. 12B.

DESCRIPTION OF PREFERRED EMBODIMENT

Figure 1A:
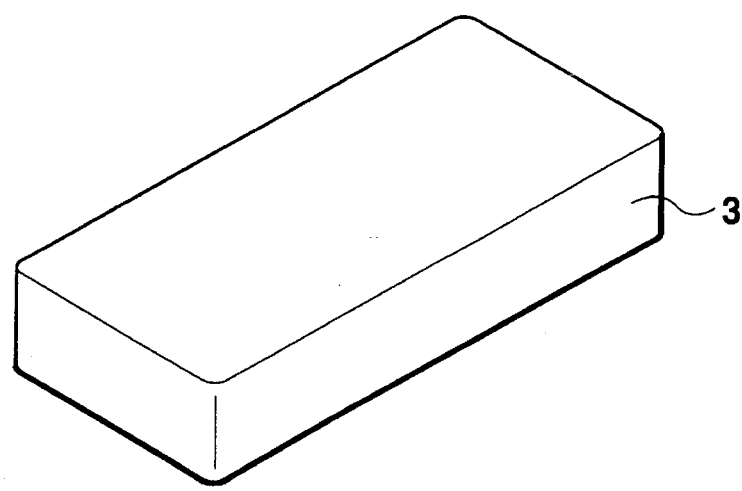
FIGS. 1A, 1B and 1C are perspective views illustrating elements of a piezoelectric oscillator in accordance with the invention, where
Figure 1B:
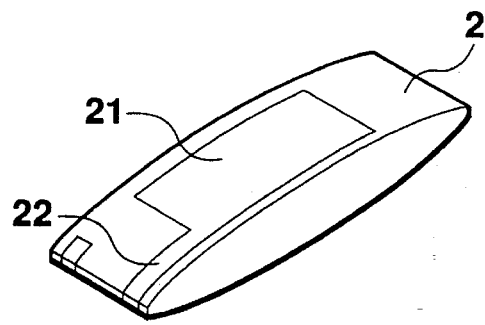
Figure 1C:
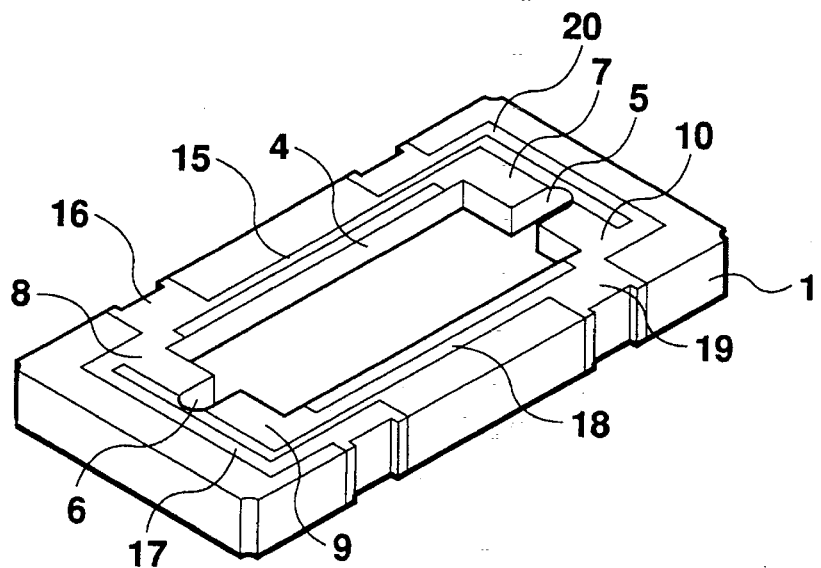

A piezoelectric oscillator of the invention comprises a ceramic substrate 1 as an insulating substrate, an AT quartz oscillating reed 2, and a ceramic cap 3, which are shown in FIGS. 1A, 1B and 1C, respectively. A rectangular recess 4 is formed on the substrate 1 for receiving a bottom portion of the AT quartz oscillating reed 2. From the middle of the shorter sides of the recess 4, separation grooves 5 and 6 extend outwardly for disconnection of conductive adhesive, detailed of which will be described below. "AT" represents a cutting orientation of the quartz oscillating reed 2.

Figure 2A:
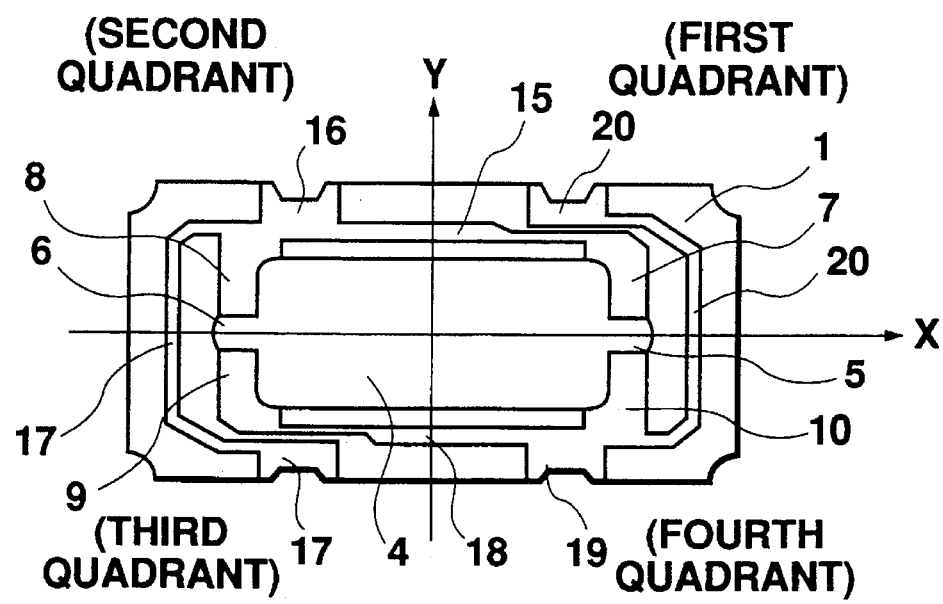
FIGS. 2A, 2B and 2C show the detailed structure of the substrate shown in FIG. 1C, where
Figure 2B:
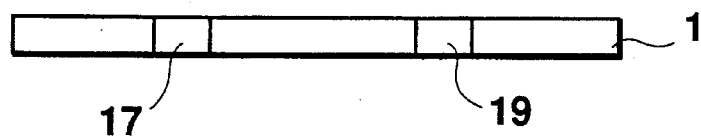
Figure 2C:
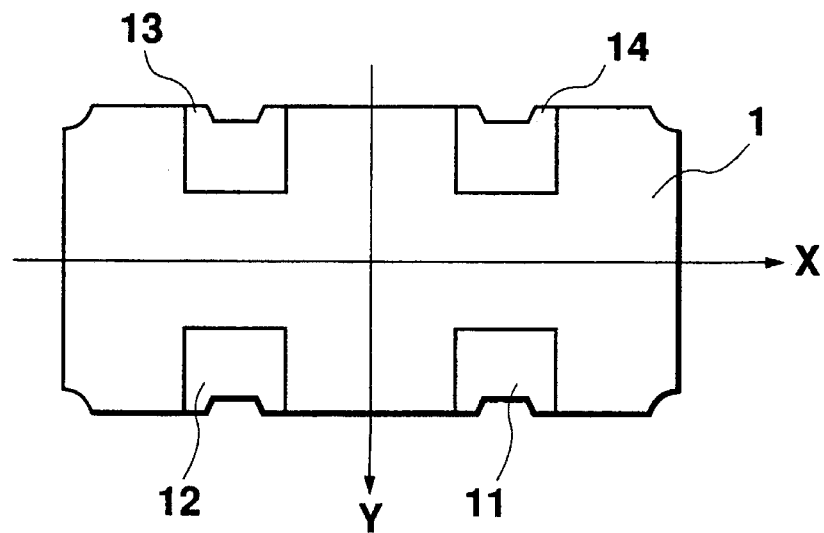

Layout of electrical interconnection of the substrate is shown in FIGS. 2A, 2B and 2C. As is shown in FIG. 2A, the substrate 1 can be imagined as divided into four sections (first to fourth quadrants) by X and Y axes passing the center of the substrate and parallel to the longitudinal and width directions, respectively. First to fourth connecting electrodes 7, 8, 9 and 10 are formed in the first to fourth quadrants of the substrate, respectively, by metalizing. A separation groove 5 is located across the first and fourth quadrants, while a separation groove 6 is located across the second and third quadrants. The first and fourth connecting electrodes 7 and 10 are adjacent to the groove 5 and are opposed to each other with the groove 5 therebetween. The second and third connecting electrodes 8 and 9 are adjacent to the groove 6 and are opposed to each other with the groove 6 therebetween.

On the bottom surface of the substrate 1, first to fourth external electrodes 11–15 are formed in the areas corresponding to the first to fourth quadrants of the top surface. Metal portions of the substrate are hatched and dotted as a matter of convenience, for clarifying the drawings to show each of the groups.

The first and second connecting electrodes 7 and 8 are connected to each other by a first metal interconnect 15, while the third and fourth connecting electrodes 9 and 10 are connected to each other by a fourth metal interconnect 18. Both metal interconnects are formed by, for example, metalizing. The first metal interconnect 15 is connected to the second external electrode 12 via a second metal interconnect 16 which extends along the side surface through the substrate 1 in the second quadrant. The second connecting electrode 8 is connected to the third external electrode 13 via a third metal interconnect 17 which extends over the second and third quadrants along a shorter edge of the top surface of the substrate 1 and then down to the bottom along the side surface through the substrate 1 in the third quadrant. Similarly, a fourth metal interconnect 18 is connected to the fourth external electrode 14 via a fifth metal interconnect 19 which extends along the side surface through the substrate 1 in the fourth quadrant. The fourth connecting electrode 10 is connected to the first external electrode 11 via a sixth metal interconnect 20 which extends over the first and fourth quadrants along the other shorter edge of the substrate 1 and down to the bottom along the side surface through the substrate 1 in the first quadrant. The metal interconnects 16, 17, 19 and 20 may be formed by metalizing.

As seen from FIGS. IC and 2A, a group of first to third metal interconnects 15, 16 and 17 and a group of fourth to sixth metal interconnects 18, 19 and 20 are arranged so as to be point symmetry about the center point of the substrate 1.

The AT quartz oscillating reed 2 has a biconvex shape, where a top view is rectangular and side view along the longitudinal axis is biconvex consisting of two arcs. This shape is suitable for shutting the oscillation energy therein. On either convex surface of the oscillating reed 2, an excitation electrode 21 is formed, from which a lead electrode 22 extends towards only one end of the oscillating reed. The excitation electrodes 21 on upper and lower convex surfaces of the oscillating reed 2 are opposed to each other, and the lead electrodes 22 extending from each of the excitation electrodes 22 toward one end of the reed are in symmetry about the longitudinal axis of the oscillating reed, that is, offset from the longitudinal axis in the opposite direction. On the other end of the oscillating reed 2, no lead electrode is provided.

When placing the AT quart oscillating reed 2 on the substrate 1 by using a tool so that the longitudinal and latitudinal axes of the oscillating reed and the substrate meet each other, without considering its direction, two situations will occur. That is, a first situation where the lead electrodes 22 contact the first and fourth connecting electrodes 7 and 10, and a second situation where the lead electrodes 22 contact the second and third connecting electrodes 8 and 9. These two situations are shown in FIGS. 3A and 3B, respectively.

Figure 3A:
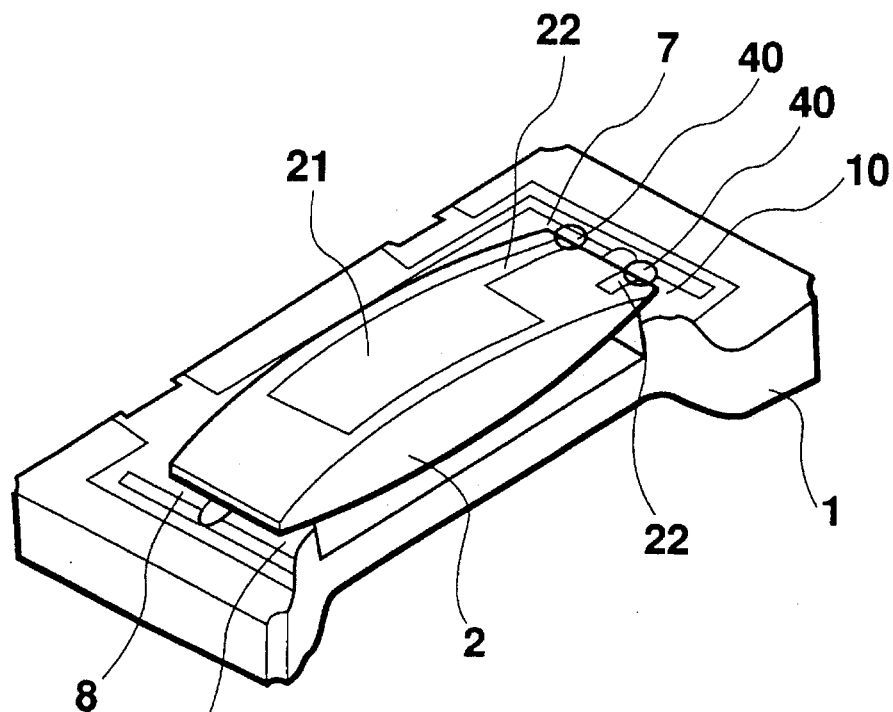
FIGS. 3A and 3B show combinations of the oscillating reed and the substrate of FIGS. 1B and 1C, where

Taking the first situation as an example, as is shown in FIG. 3A, one of the lead electrodes 22 is connected to the first connecting electrode 7, and the other lead electrode 22 is connected to the fourth connecting electrode 10 at the same end of the AT quartz oscillating reed 2. The one end of the AT quartz oscillating reed 2 is bound to the top surface of the substrate 1 by conductive adhesive 40. The other end portion of the AT quartz oscillating reed 2, where there is no lead electrode provided, is positioned over the second and third connecting electrodes 8 and 9. However, the excitation electrode 21 is formed in the area which does not meet the connecting electrodes 8 and 9, and no electrical connection will be caused on this side even when the AT quartz oscillating reed 2 contacts these connecting electrodes 8 and 9. On one end of the AT quartz oscillating reed, one of the excitation electrodes 21 is connected via the associated lead electrode 22 to the connecting electrode 7, and further to the second and third external electrode 12 and 13 via metal interconnects. The other excitation electrode 21 is connected via the associated lead electrode 22 to the connecting electrode 10, and further to the first and fourth external electrodes 11 and 14 via metal interconnects. At this point, electrical conducting means (four terminals in appearance, but two terminals in substance) and the mechanical oscillating means of the piezoelectric oscillator are combined.

Figure 3B:
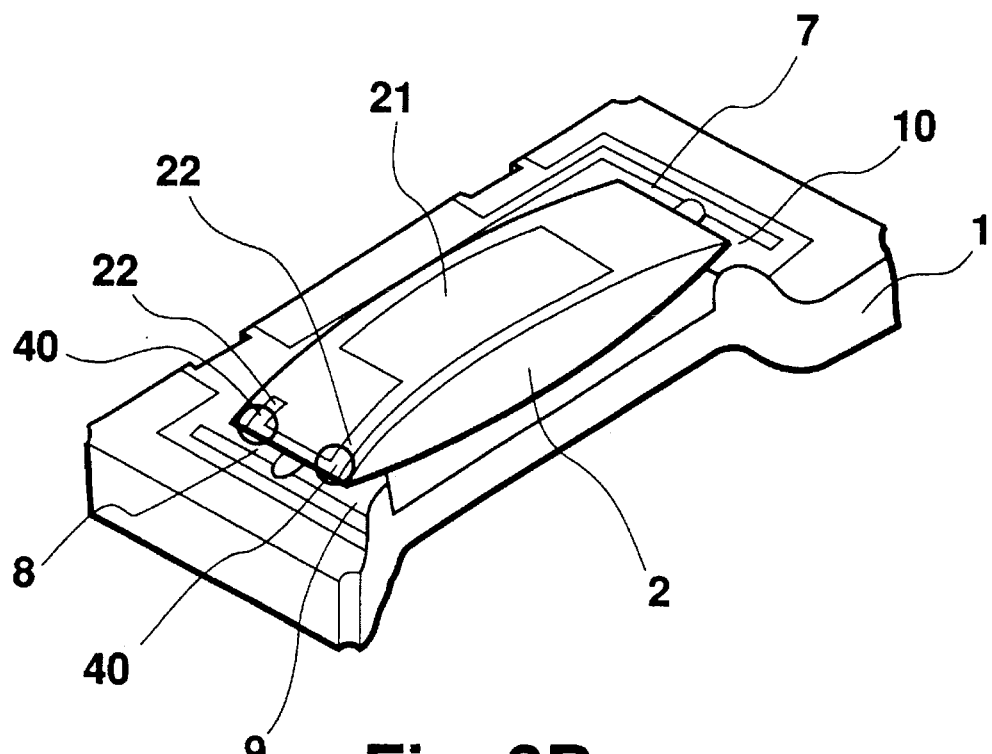

On the other hand, in the second situation shown in FIG. 3B, one of the lead electrodes 22 is connected to the second connecting electrode 8 and the other lead electrode 22 is connected to the third connecting electrode 9 at one end of the AT quartz oscillating reed 2. The one end of the AT quartz oscillating reed 2 is fixed to the top surface of the substrate 1 by conductive adhesive 40. Although the other end of the AT quartz oscillating reed 2 is positioned over the first and fourth connecting electrodes 7 and 10, the excitation electrode 21 does not reach these connecting electrodes even when the other end contacts the connecting electrodes 7 and 10, and therefore, there is no electrical connection on this side. On one end of the AT quartz oscillating reed, one of the excitation electrodes 21 is connected via the associated lead electrode 22 to the second connecting electrode 8, and further to the second and third external electrodes 12 and 13 via metal interconnects. The other excitation electrode 21 is connected via the associated lead electrode 22 to the third connecting electrode 9, and further to the first and fourth external electrode 11 and 14. Thus, electrical conducting means (four terminals in appearance, and two terminals in substance) and mechanical oscillating means of the AT quartz oscillator are connected.

When completing the adhesion of the one end of the AT quartz oscillating reed 2 on the top surface of the substrate, the adhered portion is cured at 400 ° C. After the cure, the other end of the AT quartz oscillating reed 2, which is not adhered to the substrate, is generally freely apart from the top surface of the substrate, which allows the AT quartz oscillating reed 2 to maintain its resonance characteristics. If necessary, adjustment of the oscillating frequency of the AT quartz oscillating reed can be carried out at this stage by evaporation or other method. Then, a cap 3 is attached to the substrate 1 in a nitrogen atmosphere at a sealing temperature of about 400° C., and finally, the AT quartz oscillator is completed.

Figure 4:
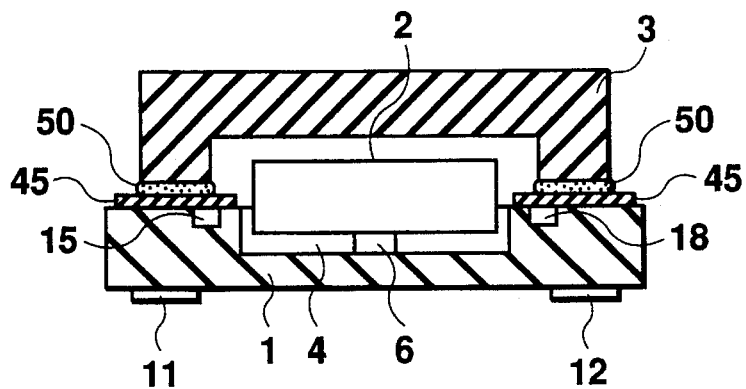
FIG. 4 is a cross-sectional side view of a completed oscillator of the first embodiment seen from the longer side of the oscillator.

For sealing, a protecting layer 45 (see FIG. 4) of insulating material, such as ceramics, is formed on the top surface of the substrate around the recess, except for on the first to fourth connecting electrodes 7, 8, 9 and 10, to cover the first to sixth metal interconnects 15, 16, 17, 18, 19 and 20. The protecting layer 45 and the cap 3 made of ceramic are bound to each other by using glass 50 having a low melting point. The cross sectional view of the completed piezoelectric oscillator seen from the longitudinal side is shown in FIG. 4. In the case that the cap 3 is made of metal, the surface of the protecting layer 45 is metalized prior to the binding, and the cap 3 is bound to the substrate by using solder having a high melting point. The same protecting layer 45 is used in the other different examples.

Since the connecting electrodes 7, 8, 9, 10 are totally identical and are arranged in point symmetry, the AT quartz oscillating reed 2 can be placed on and bound to the substrate 1 in any directions of the lead electrode 22 of the AT quartz oscillating reed 2. Thus, a surface-mounted type thin quartz oscillator, which is more suitable for mechanization than the conventional oscillator and has higher working efficiency, is achieved.

A group of first to third metal interconnects 15, 16 and 17, which are used in the first situation, and a group of fourth to sixth metal interconnects 18, 19 and 20, which are used in the second situation, have the same area size, and their shape and arrangement are in point symmetry about the center point of the substrate 1. Therefore, loaded capacitance generated in the excitation electrode 21 and metal interconnect is the same between the first and second situations. Thus, irrespective of the direction of the AT quartz oscillator, the equivalence capacitance for a quartz oscillator is constant, and oscillating frequency is always constant.

On the bottom surface of the substrate 1, the external electrodes of opposite polarity are provided symmetrically about the Y axis, which enables mounting of the small sized quartz oscillator in accordance with the module on the printed-wire substrate used in an electrical equipment. The external electrodes of the same polarity are provided symmetrically about the X axis, which enables application to various printed-wiring of the substrate.

Figure 5A:
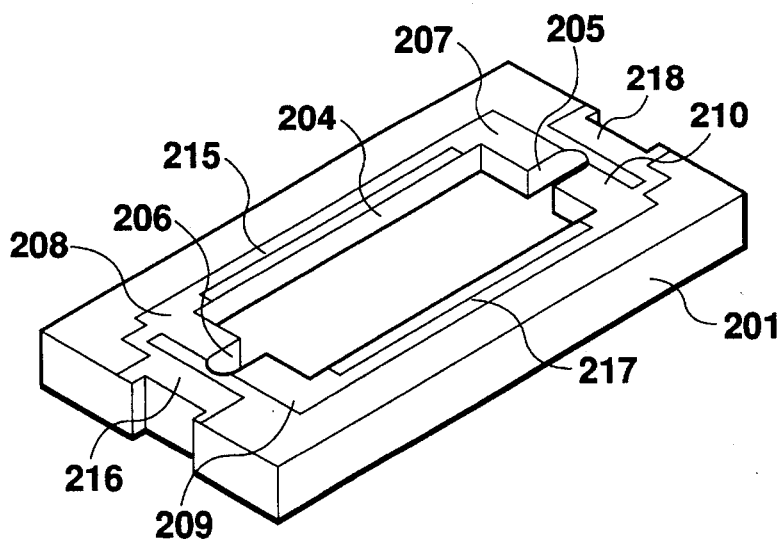
FIGS. 5A and 5B illustrate another example of the substrate, where
Figure 5B:
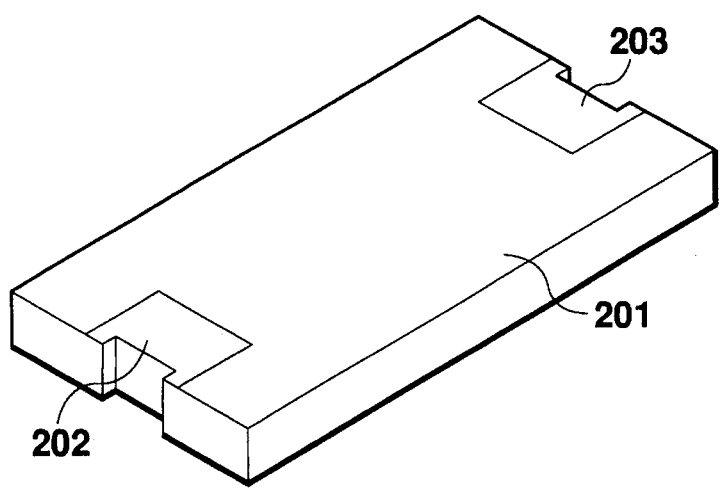

FIGS. 5A and 5B show another example of the substrate. A piezoelectric oscillator comprises a substrate 201, an AT quartz oscillating reed 2, and a cap 3. The AT quartz oscillating reed 2 and the cap 3 are the same as those shown in FIGS. 1A and 1B. On the top surface of the substrate 201, a recess 205, separation grooves 205 and 206, first to fourth connecting electrodes 207, 208, 209 and 210 are formed, which are the same as those described in connection with the first example. The first and second connecting electrodes 207 and 208 are connected to each other via a first metal interconnect 215, while the third and fourth connecting electrodes 209 and 210 are connected to each other via a third metal interconnect 217, similarly to the first example.

In this example, the number of external electrodes formed on the bottom of the substrate 201 is two, as is shown in FIG. 5B. A first external electrode 202 is formed across the first and fourth quadrants, while a second external electrode 203 is located across the second and third quadrants. The second connecting electrode 208 is connected to the first external electrode 202 via the second metal interconnect 216 through a longitudinal side wall of the substrate 201. The fourth connecting electrode 210 is connected to the second external electrode 203 via the fourth metal interconnect 218 through the other longitudinal side wall of the substrate 201.

A group of the first and second metal interconnects 215 and 216 and a group of the second and third metal interconnects 217 and 218 are the same in area size, and are arranged in point symmetry about the center point of the substrate 201. When the AT quartz oscillating reed 2 is placed in the recess of the substrate 201, one of the excitation electrodes 21 on the oscillating reed 2 is connected to the first external electrode 202, and the other excitation electrode 21 is connected to the second external electrode 203. Thus, the AT quartz oscillator having two terminals is completed by attaching and sealing the cap 3 to the substrate 201. This two-terminal oscillator has the same effect and advantage as the four-terminal oscillator of the first example.

Figure 6A:
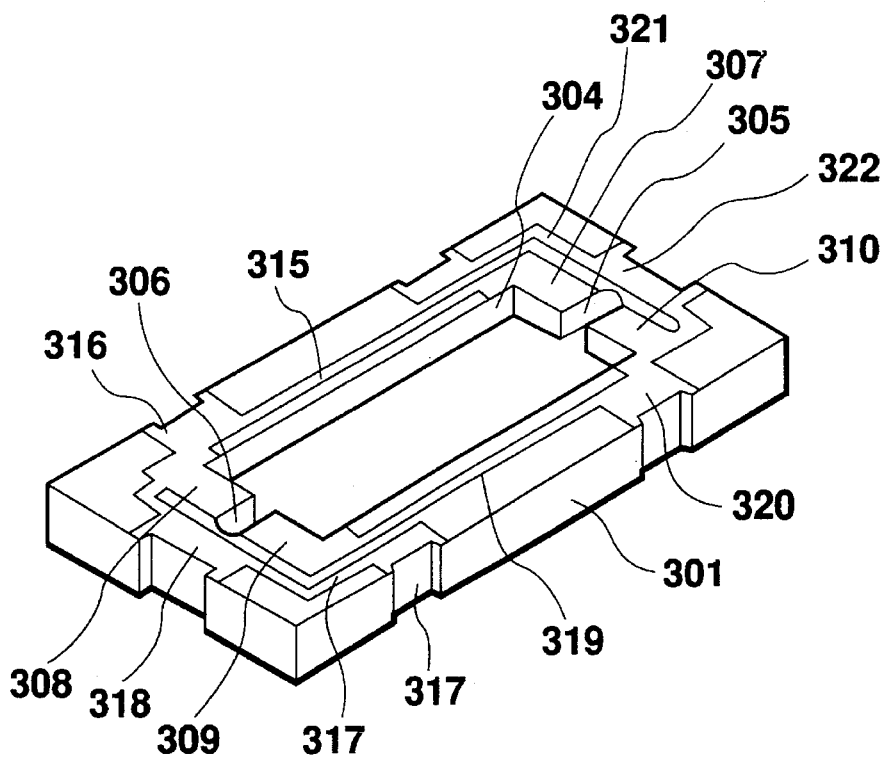
FIGS. 6A and 6B illustrate still another example of the substrate, where
Figure 6B:
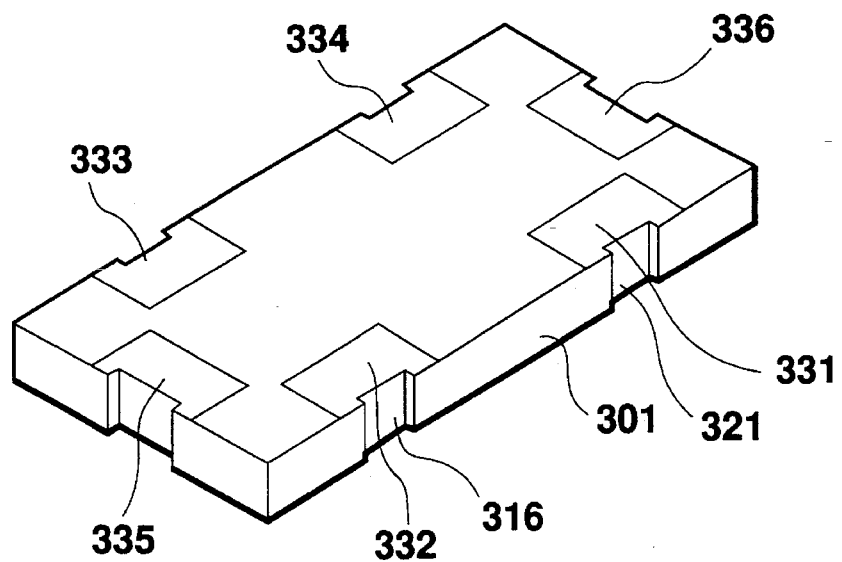

FIGS. 6A and 6B show still another example of the substrate. The AT quartz oscillator of this example comprises a ceramic substrate 301, an AT quartz oscillating reed 2, and a cap 3. The AT quartz oscillating reed 2 and the cap 3 are the same as those shown in FIGS. 1A and 1B. Similarly to the first example, a recess 304, separation grooves 305 and 306, and first to fourth connecting electrodes 307, 308, 309 and 310 are formed on the substrate 301. On the bottom surface of the substrate 301, as is shown in FIG. 6B, six external electrodes are provided. The first to fourth external electrodes 331, 332, 333 and 334 are formed in the areas corresponding to the first to fourth quadrant of the top surface, respectively. The fifth external electrode 335 is formed across the second and third quadrants, and the sixth external electrode 336 is located across the first and fourth quadrants.

The first and second connecting electrodes 307 and 308 are connected to each other by a first metal interconnect 315, while the third and fourth connecting electrode 309 and 310 are connected to each other by a fifth metal interconnect 319. The first metal interconnect 315 is connected to the second external electrode 332 via a second metal interconnect 316 through a shorter side wall of the substrate 301 in the second quadrant. The first connecting electrode 307, which is connected to the second connecting electrode 316, is connected to the third external electrode 333 via a third metal interconnect 317 which extends over the second and third quadrants on the top surface of the substrate 301 and then down to the bottom along the side wall in the third quadrant. The third metal interconnect 317 is also connected to the fifth external electrode 335 via a fourth metal interconnect 318 which extends through the shorter side wall of the substrate 301 across the second and third quadrants.

The fifth metal interconnect 319 is connected to the fourth external electrode 334 via a sixth metal interconnect 320 through the longer side wall in the fourth quadrant. The fourth connecting electrode 310 is connected to the first external electrode 331 via a seventh metal interconnect 321 which extends over the first and fourth quadrants and then down to the bottom through the side wall in the first quadrant. The seventh metal interconnect is also connected to the sixth external electrode 336 via a eighth metal interconnect 322 through the shorter side wall of the substrate 301 across the first and fourth quadrant.

With this structure, a group of the first and second connecting electrode 307 and 308 is connected to the second, third and fifth external electrodes 332, 333 and 335, while a group of the third and fourth connecting electrodes 309 and 310 is connected to the first, fourth and sixth external electrodes 331, 334 and 336.

A group of the first to fourth metal interconnects 315, 316, 317 and 318 and a group of the fifth to eighth metal interconnects 319, 320, 321 and 322 are the same in area size, and are arranged in point symmetry about the center point of the substrate 301. With this structure, when placing the AT quartz oscillating reed 2 in the recess of the substrate 301, one of the excitation electrodes 21 on the oscillating reed 2 is connected to the second, third and fifth external electrodes 333, 334 and 335, and the other excitation electrode 21 is connected to the first, fourth and sixth external electrodes 331, 334 and 336. Thus, the surface-mounted type AT quartz oscillator having six terminals in appearance but two terminals in substance is completed by attaching and sealing the cap 3 to the substrate 301.

This quartz oscillator has the same effect and advantages as the first example, and besides, it is applicable to a more complicated printed-wiring substrate.

Figure 7:
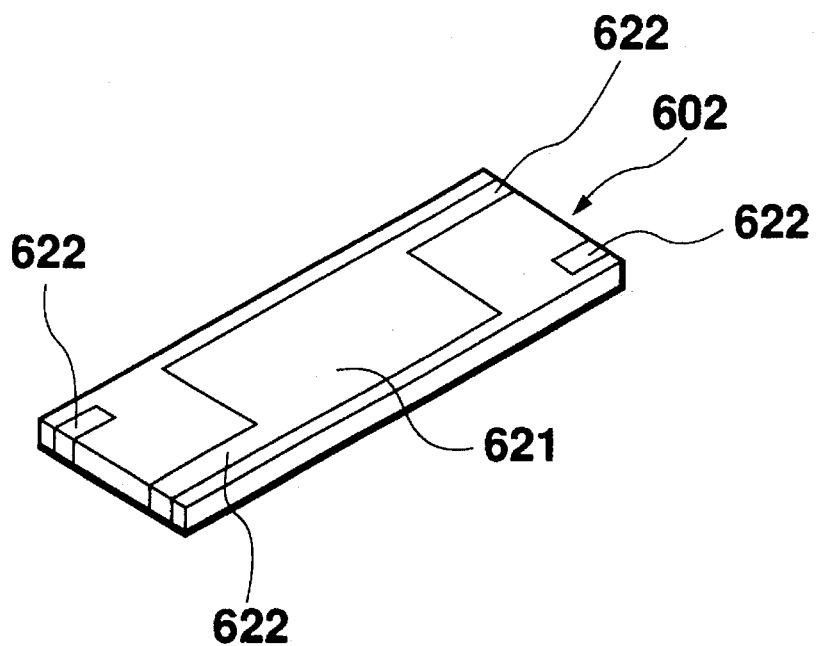
FIG. 7 shows another example of the piezoelectric oscillating reed mounted on the substrate.
Figure 8:
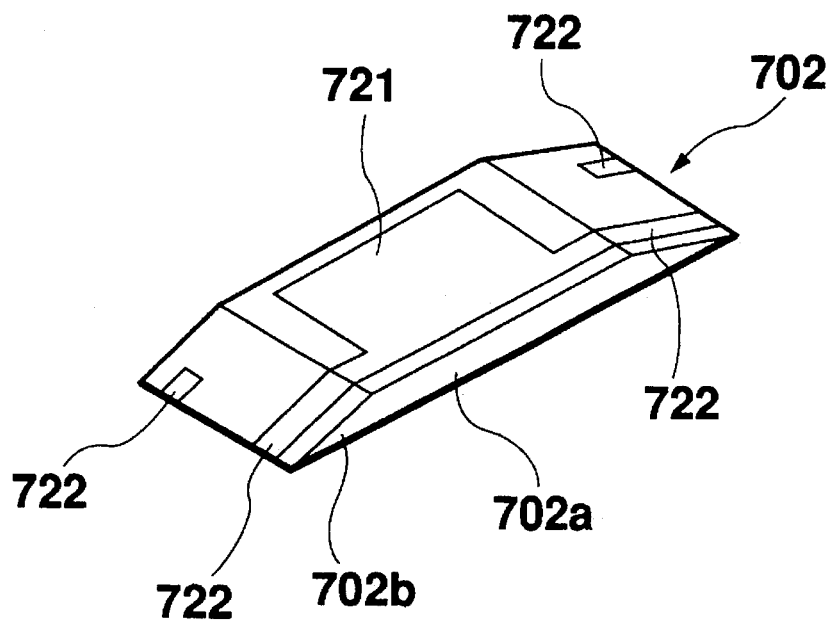
FIG. 8 shows still another example of the piezoelectric oscillating reed mounted on the substrate.

Modifications of the piezoelectric oscillating reed (such as an AT quartz oscillating reed) are shown in FIGS. 7 and 8. Other than the biconvex shape, the side view in the longitudinal direction of the oscillating reed may be rectangular or trapezoid. The lead electrode on the oscillating reed may extend toward both ends thereof.

In more detail, the piezoelectric oscillating reed 602 shown in FIG. 7 has a rectangular top view, and its longitudinal side view is also rectangular in shape. On the top and bottom surfaces, excitation electrodes 621 are provided, each of which has lead electrodes 622 extending from the diagonal corners in the opposite direction toward either end, being offset from the longitudinal axis. In other words, the lead electrodes 622 are arranged in point symmetry about the center of the oscillating reed 602.

In the modification shown in FIG. 8, the oscillating reed 702 has a rectangular top view, and has slopes 702b slanting from the top to the bottom surface at both its ends along the longitudinal direction. The longitudinal side walls 702a are parallel to each other. The excitation electrodes 721 are provided on the top and bottom surfaces to be opposed to each other, from each of which a lead electrode 722 extends in the opposite direction toward either end of the oscillating reed 702. The lead electrodes 722 of the top and bottom surfaces are arranged in symmetry about the longitudinal center axis of the oscillating reed 702.

The material of the piezoelectric oscillator of the invention is not limited to quartz, and other materials, such as lithium tantalate or barium titanate, can be used. Further, the container consisting of the cap and the substrate is applicable not only to the piezoelectric oscillator, but also to a filter using a piezoelectric oscillating reed.

Figure 9A:
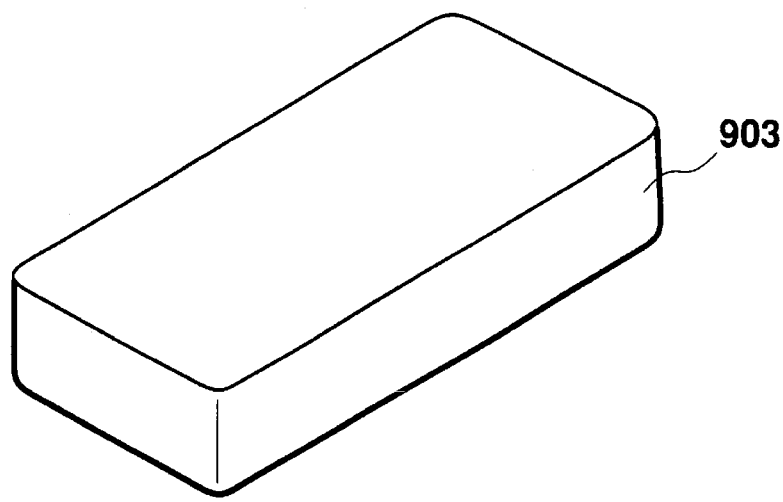
FIGS. 9A, 9B and 9C illustrate elements of the piezoelectric oscillator in accordance with another embodiment of the invention, where
Figure 9B:
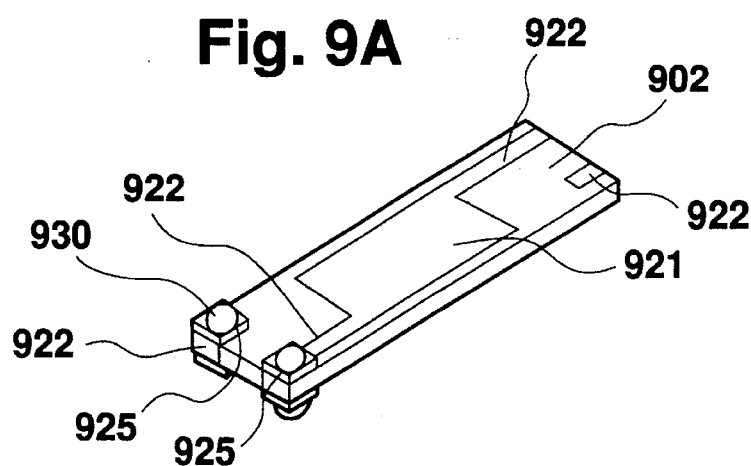
Figure 9C:
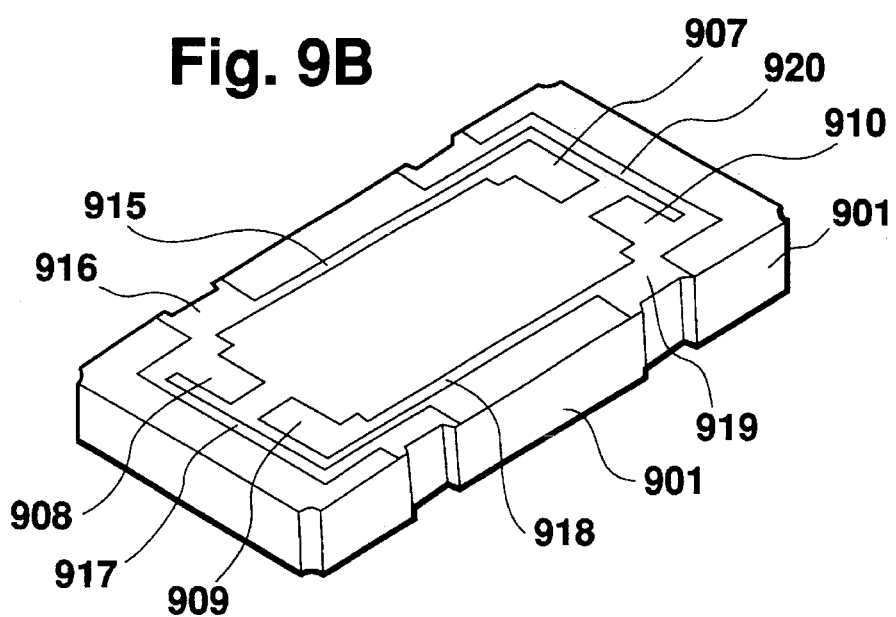
Figure 10:
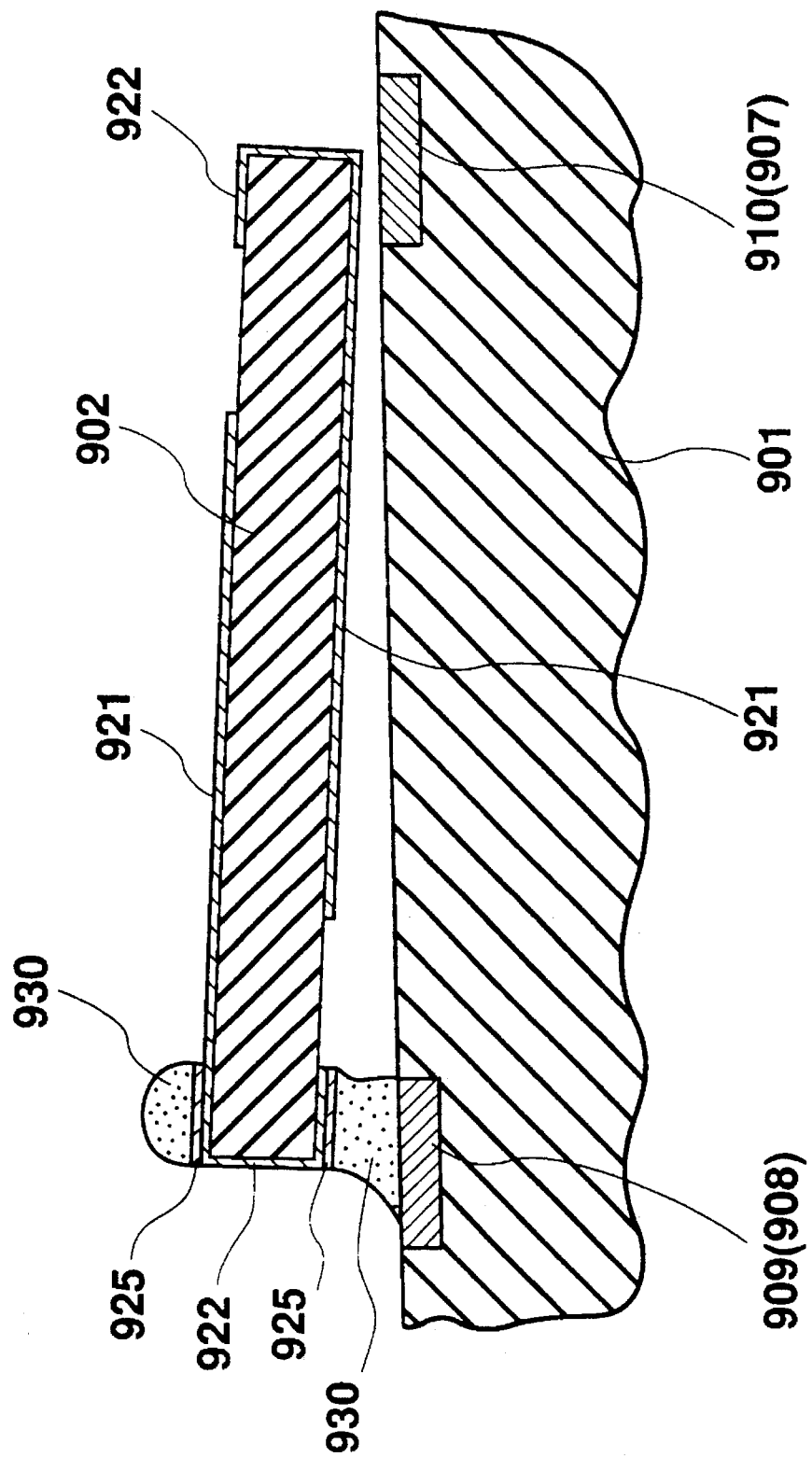
FIG. 10 illustrates combination of the piezoelectric oscillating reed and the substrate shown in FIGS. 9B and 9C.

Still another modification of the piezoelectric oscillator is shown in FIGS. 9A, 9B and 9C, illustrating a cap 903, a piezoelectric oscillating reed 902 and a substrate 901, respectively. The substrate in this example has no recess or separation grooves which are formed in the first example, and has a plane top surface. The other elements of the substrate 901 are the same as those in the first example. That is, first to fourth connecting electrodes 907, 908, 909 and 910, first to sixth metal interconnects 915, 916, 917, 918, 919 and 920, and first to fourth external electrodes are provided.

A piezoelectric oscillating reed 902 used in this example is the same type as shown in FIG. 7. Similarly to the lead electrode 622 in FIG. 7, a lead electrode 922 extends from the diagonal corners of the excitation electrode 921 in the opposite direction toward either end of the oscillating reed 902, and the lead electrodes 922 on the top and bottom surface are arranged in point symmetry about the center point of the oscillating reed 902. At one end of the oscillating reed 902, a pad 925 is provided on the end portion of the each lead electrode 922. The pad 925 covers over a end portion of the lead electrode from the top through the side to the bottom surface. Solder or adhesive 930 is thickly applied on the pad 925 on both top and bottom surface. The piezoelectric oscillating reed 902 is placed onto the substrate 901 so that the pads 925 meet the first and fourth connecting electrodes 907 and 910, or alternatively the second and third connecting electrodes 908 and 909. The position of the oscillating reed 902 is controlled in the horizontal direction by a tool, and binding between the pads 925 and the connecting electrodes is carried out by heating them under the position control. In this manner, the oscillating reed 902 is mounted on the substrate 901 and the the excitation electrodes 922 is connected to the external electrodes. The other end portion of the oscillating reed 902, which is not adhered to the substrate, is spaced away and free from the connecting electrodes on the top surface of the substrate 901 as a result of a curing effect of the adhesive. As a result, vibration of the oscillating reed 902 is not restricted. Adjustment of the frequency is carried out at this stage. Finally, the cap 903 is covered over the substrate 901 and is sealed to complete the piezoelectric oscillator.

Various piezoelectric oscillating reeds, such as an AT quartz oscillating reed, are manufactured and commercially available. Some of them have lead electrodes extending toward only one end, others have them extending toward either end thereof. The container consisting of a substrate and a cap in accordance with the invention is applicable to both types of oscillating reed.

The thickness of the piezoelectric oscillating reed is preferably less than 2.5 mm. The thickness of the insulating substrate is preferably larger than the height of the cap. The thickness of the top wall of the cap is preferably smaller than the height of the recess of the cap.

Figure 11A:
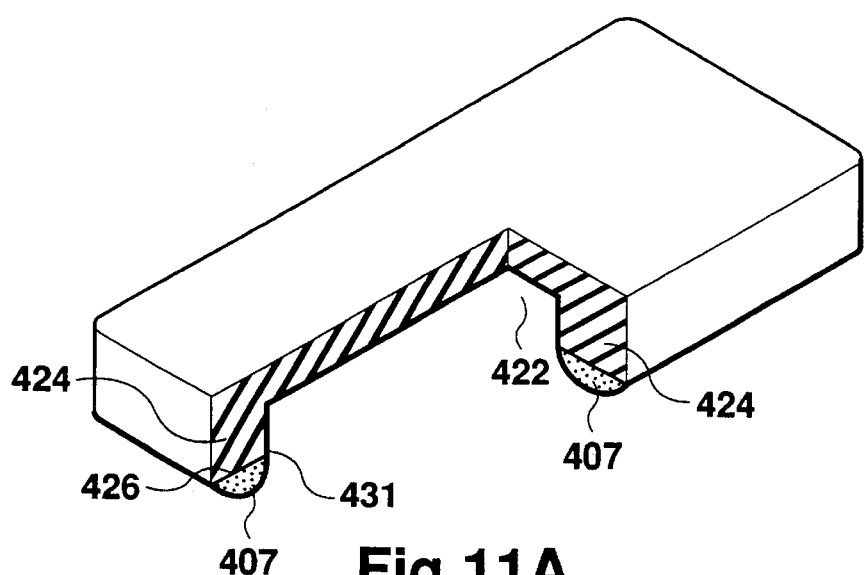
FIGS. 11A, 11B and 11C illustrate elements of the piezoelectric oscillator in accordance with still another example of the invention, where
Figure 11B:
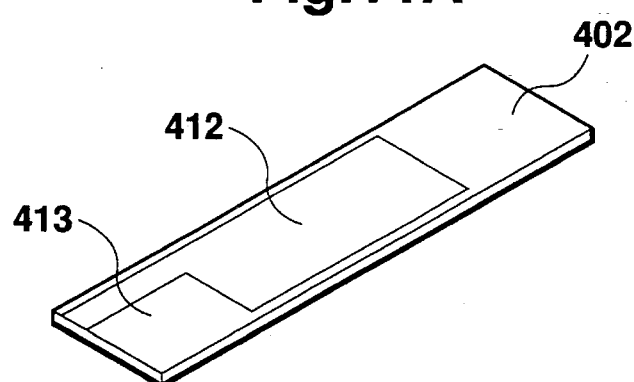
Figure 11C:
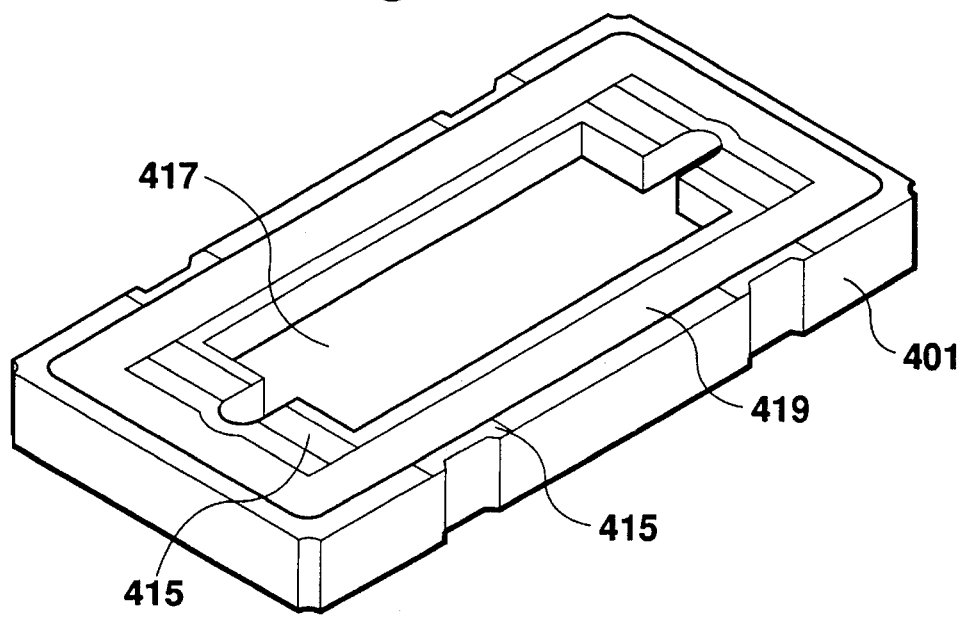
Figure 12A:
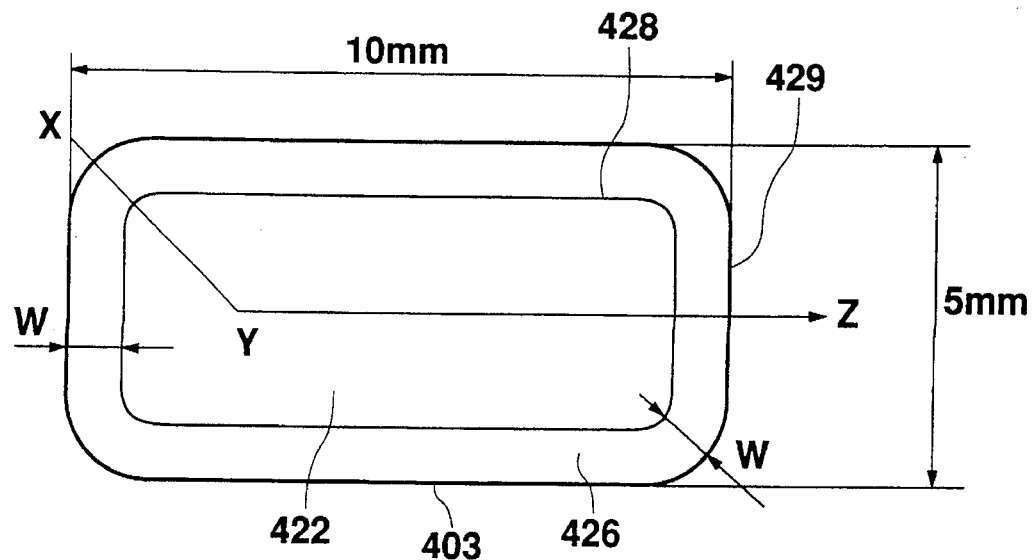
FIGS. 12A, 12B and 12C illustrate a cap shown in FIG. 11A, where
Figure 12B:
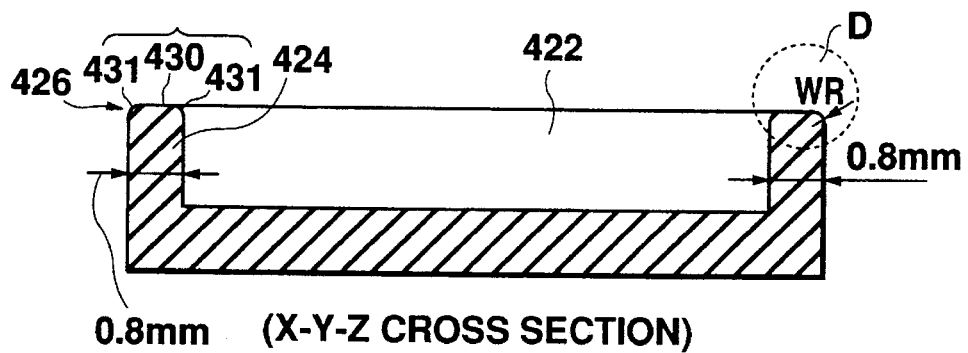
Figure 12C:
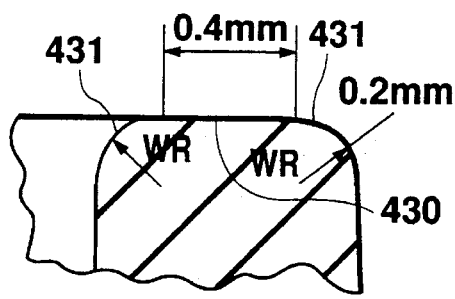
Figure 13:
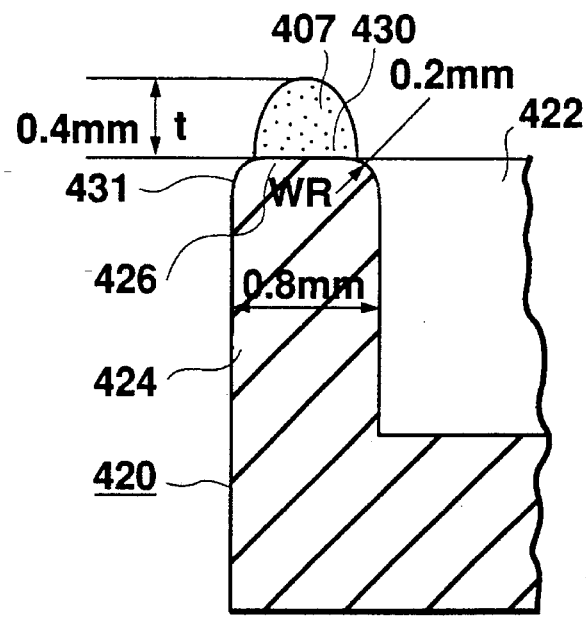
FIG. 13 shows glass having a low melting point applied on the bottom surface of the cap with particular dimensions as an example.

The shape of the cap in accordance with the invention will now be described in detail. FIGS. 11A, 11B and 11C show a modification of the piezoelectric oscillator comprising a cap 403, a piezoelectric oscillating reed 402, and a substrate 401, respectively. FIGS. 12A, 12B and 12C illustrate the cap 403 in more detail with numerical values of the dimensions. FIG. 12A is a bottom view of the cap 403, and FIG. 12B is a cross-sectional view along the X-Y-Z line of the FIG. 12A. The portion D in FIG. 12B is enlarged, which is shown in FIG. 12C. Glass paste 407 having a low melting point is applied onto the end surface (binding surface) of the cap 403, as is shown in FIG. 13, for the binding to the substrate 401, and FIG. 14 cross-sectionally illustrates a completed piezoelectric oscillator with the piezoelectric oscillating reed 402 being inside the sealed container consisting of the substrate 401 and the cap 403.

Figure 14:
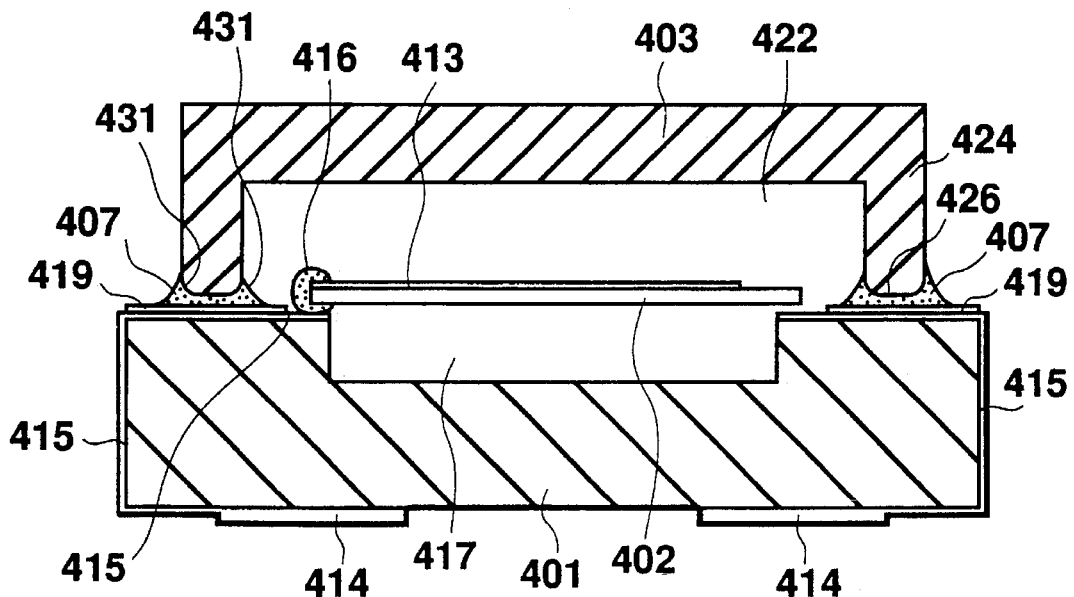
FIG. 14 is a cross-sectional view showing air tight sealing of the container of the piezoelectric oscillator.

The piezoelectric oscillating reed 402 is mounted on the rectangular substrate 401 made of insulating material such as ceramics or glass. A recess 417 and lead electrodes 415 connectable to the external equipment are formed on the substrate 401. On the top surface of the substrate 401 around the recess 417, a protecting layer 419 of insulating material is formed so as to overlap a portion of the lead electrodes 415. The piezoelectric oscillating reed 402 has a excitation electrode 412 and a lead electrode 413 extending from the excitation electrode. One end of the oscillating reed 402 is fixed to the substrate 401 by conductive adhesive 416 so that the lead electrode 413 is connected to the lead electrode 415 of the substrate 401, as is shown in FIG. 14. On the end surface of the cap 403 which functions as a binding surface 426, glass paste 407 having a low melting point is applied. The cap is covered onto the substrate 401 and sealed.

The cap 403 has side walls 424 which form a space 422 for storing the piezoelectric oscillating reed 402. As has been described, the end surface 426 of the side walls 424 serves as a binding surface to the substrate 401, and its bottom view is constructed by a nearly rectangular inner periphery 428 and outer periphery 429 with their corners being rounded, as shown in FIG. 12A. In this example, the length and the width of the cap 403 are set to 10 mm and 5 mm, respectively. The cap 403 is formed so that the width of the end surface 426 (that is, a distance between the inner and outer peripheries 428 and 429) is equal at any portion of the end surface. For this reason, the four corners are rounded to have the same width W, which is set to 0.8 mm in this example. Thus, the binding area, to which sealing agent (low melting point glass paste 407) is applied, is uniform at any portion of the end surface 426, thereby preventing the concentration of the sealing agent to a particular area. In a conventional cap having corners with a right angle, the width of the corner portions is greater than the other wall portions, and the sealing agent is apt to concentrate to the larger corner areas. This drawback is avoided by making the width of the end surface uniform.

An enlarged cross-sectional view of the end portion of the cap 403 is shown in FIG. 12C. The edges of the end surface 436 are chamfered with a radius of curvature WR so that the 0.8 mm width consists of 0.4 mm of a flat center portion 430 and 0.2 mm of rounded portions 431 on either side of the flat portion. Glass paste 407 having a low melting point is applied on the chamfered end surface 426 to a thickness of 0.4 mm. The glass paste 407 is preliminarily sintered for removing of the binder, and is degassed. After the solidification, the cap 403 is placed onto the substrate 401 so that the end surface 426 is on the protecting layer 419 on the substrate 401 via the glass 407. The thus arranged cap 403 is heated under vacuum or gas atmosphere at a temperature higher than the preliminary sintering temperature to melt the glass 407. Any clearance gaps between the protecting layer 419 and the end surface 426 of the cap 403 are filled with the molten glass 407. Thus, the cap 403 and the substrate 401 are sealed with the piezoelectric oscillating reed 402 inside. The lead electrode 413 of the piezoelectric oscillating reed 402 is electrically connected to the external electrode 414 formed on the bottom surface of the substrate 401 via conductive adhesive and lead electrode 415 extending beneath the protecting layer 419.

Since the end surface 426 of the cap 403 is uniform in dimension and shape and has chamfered portions 431, sufficient space for receiving the molten glass 407 is secured, thereby achieving uniform glass sealing all around the side walls without overflow or lack of molten glass. The uniform width of the side wall results in an uniform amount of the glass paste 407 at any portion of the binding area, which realizes firm and secured sealing.

Figure 15:
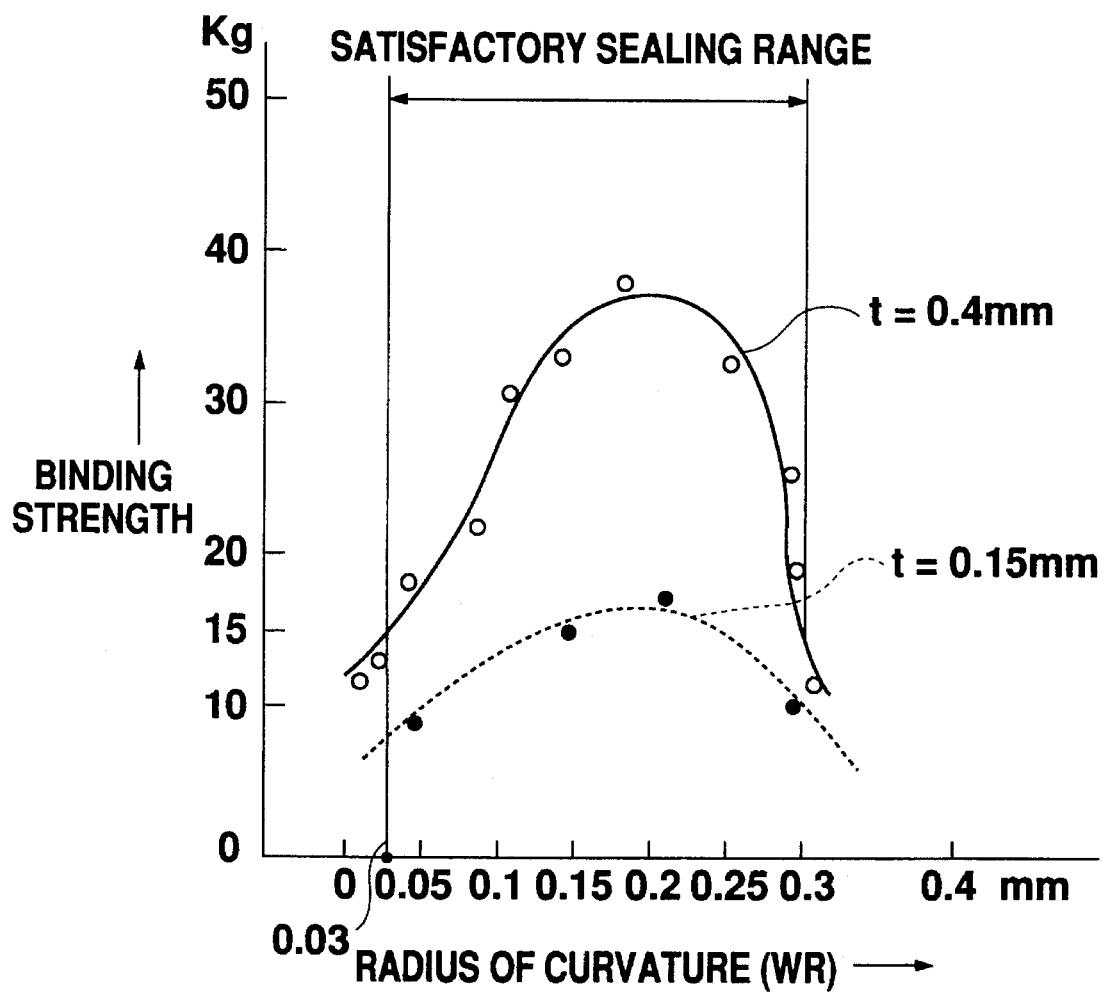
FIG. 15 is a chart showing a relationship between the radius of curvature for chamfering, and binding strength.

The relationship between the binding strength and the radius of curvature of the chamfered portion is shown in FIG. 15. The radius of curvature WR of the chamfered portion 431 is varied with the width of the end surface 426 being equal. The solid line in the chart shows the binding strength when the glass 407 having a low melting point is applied to a thickness of 0.4 mm, while the dashed line shows the binding strength when the glass 407 is applied to a thickness of 0.15 mm. (t=thickness of the glass 407) The 0.4 mm thickness of the glass 407 represents a sufficient binding strength of more than 15 Kg with a radius of curvature WR in a range of 0.03 to 0.3 mm. In this range of the radius of curvature, it was confirmed that the secured sealing was achieved.

When the radius of curvature WR is less than 0.03 mm, the space for storing the glass paste 407 under the chamfered portion 431 becomes insufficient, which means that most of the glass paste applied on the end surface 426 flows out in the horizontal direction and only a reduced amount of glass paste contributes to the binding.

On the other hand, when the radius of curvature WR is beyond 0.3 mm, the flat portion 430 is decreased and the glass 407 stays deeply under the chamfered portion 431. That is, the glass 407 does not cover a sufficient area between the protecting layer 419 and the end surface 426, which also results in a reduced binding strength. The quality of the sealing has a close relationship with the binding strength. When the binding strength is more than 15 Kg, inferior sealing seldom occurs, but when it is less than 15 Kg, the inferior sealing percentage increases.

In the example of this invention, the radius of curvature WR of the chamfered portion 431 is set to 0.2 mm. This value is located in the middle of the upper and lower limits of the range, and shows the strongest binding ability. Also, a necessary amount of glass paste 407 contributing to the binding and sealing of the container is securely held between the chamfered portion 431 and the protecting layer 419.

When the thickness of the glass 407 having a low melting point is too small, the binding strength abruptly decreases and causes inferior sealing due to lack of a sufficient amount of glass. When the glass 407 is applied too thickly, it overflows outside the container, which results in a bad appearance. The thickness of the application of the glass must be closely controlled.

Figure 16:
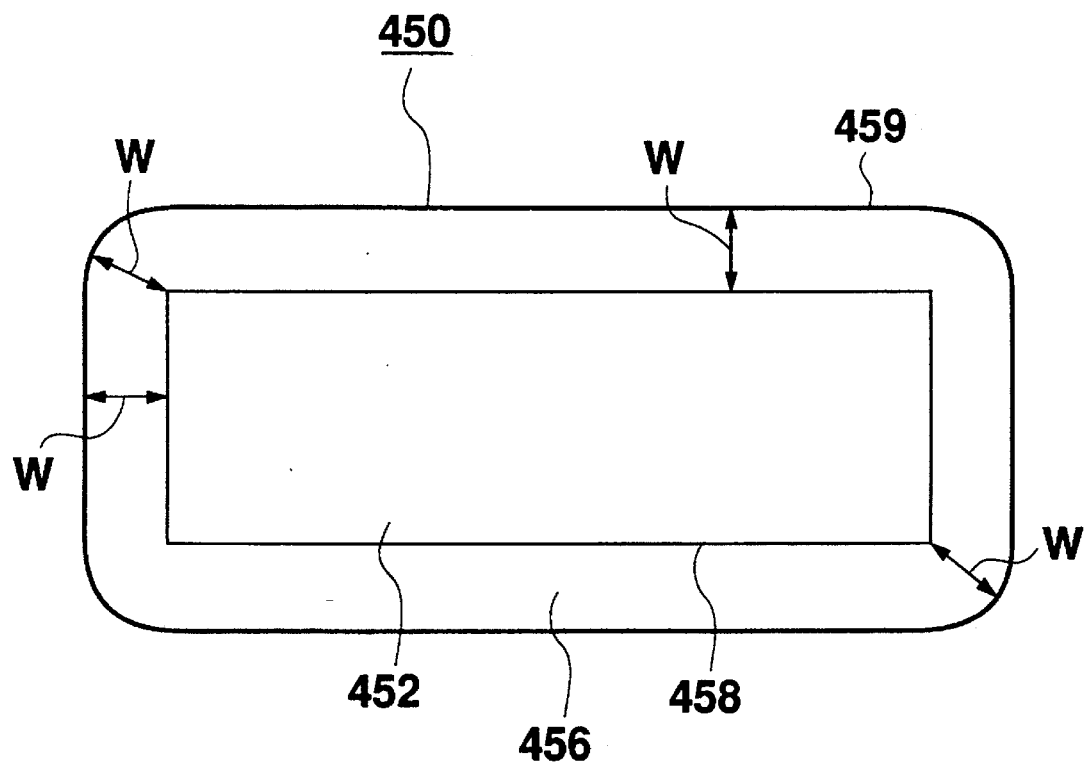
FIG. 16 is a bottom view of another example of the cap.

Only the outer corners of the cap may be made round, with the inner corner being a right angle. Such a cap 450 is shown in FIG. 16. FIG. 16 is a bottom view of the cap 450, showing the shape of the end surface 456 of the side walls of the cap 450. The inner periphery 458 of the end surface 456 is rectangular with right angles, while the outer periphery 459 has rounded corners. The width W of the end surface 456 (i,e, a distance between the outer and inner peripheries) is set equal at any portion thereof. The cross-sectional shape and dimensions of the end surface 456 are the same as those in the cap 403 described above, and are equal at any portion. Accordingly, when binding the cap 450 to the substrate 401, secured sealing is achieved and the same effect and advantages are obtained as the cap 403.

Although the binding (or sealing) effect between the substrate and the cap has been described in connection with the usage of glass paste 407 having a low melting point, epoxy resin may be used as a sealing agent. In the case of using epoxy resin, the shape of the end surface of the cap in accordance with the invention does not lose any binding effect and advantages.

Figure 17:
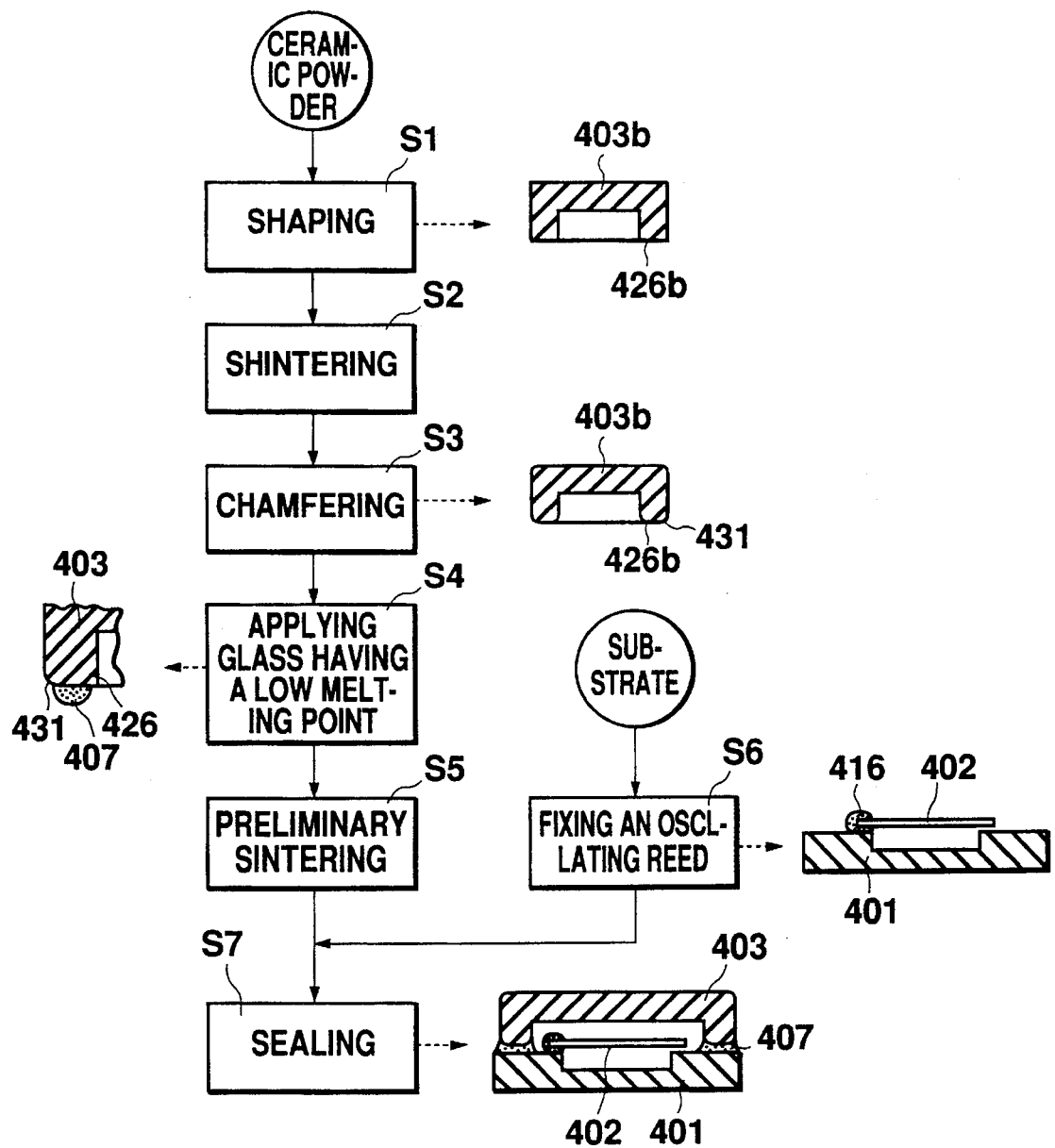
FIG. 17 is a flow chart showing fabrication processes of the piezoelectric oscillator according to the invention.

Fabrication processes of a container of a piezoelectric oscillator will now be described with reference to a flow chart of FIG. 17. The container is made by binding the substrate 401 and the cap 403 shown in FIGS. 11C and 11A, respectively. The substrate is preferably made by utilizing a green sheet, which is a known technique and the explanation is omitted here.

First, an original cap 403b is formed in step S1, by using ceramic powder made by granulation of alumina powder and a binder. The original cap 403b is subjected to a sintering process (S2) and chamfering (S3) to complete a cap 403. In step S4, glass having a low melting point 407 is applied onto the end surface 426 of the cap 403 by a dispenser, and is then preliminarily sintered in step S5 for solidification. Meanwhile, in parallel to the steps S1 to S5, an oscillating reed 402 is fixed onto the substrate 403 in step S6. In step S7, the cap 403 is attached via glass of low melting point 407 onto the substrate 401 mounting the oscillating reed 402, and the container is sealed by heating the glass of low melting point 407.

More particularly, in step S1, the original cap 403b is formed by compressing the ceramic powder by using a forming die. At this stage, the edges of the end surface 426b of the original cap 403b has not yet been chamfered. The bottom view of the original cap 403b is the same as that shown in FIG. 12A.

The original cap 403b is heated in the sintering step S2 to extinguish the binder. After degassing, the original cap is solidified.

In step S3, a plurality of sintered caps 403b are put into a cylinder of a barrel grinder together with alumina balls and lubricant for the chamfering of the end surface 426 of the original cap 403b. The cross-section of the chamfered portion 431 of the cap 403 is the same as that shown in FIG. 12C.

Figure 18:
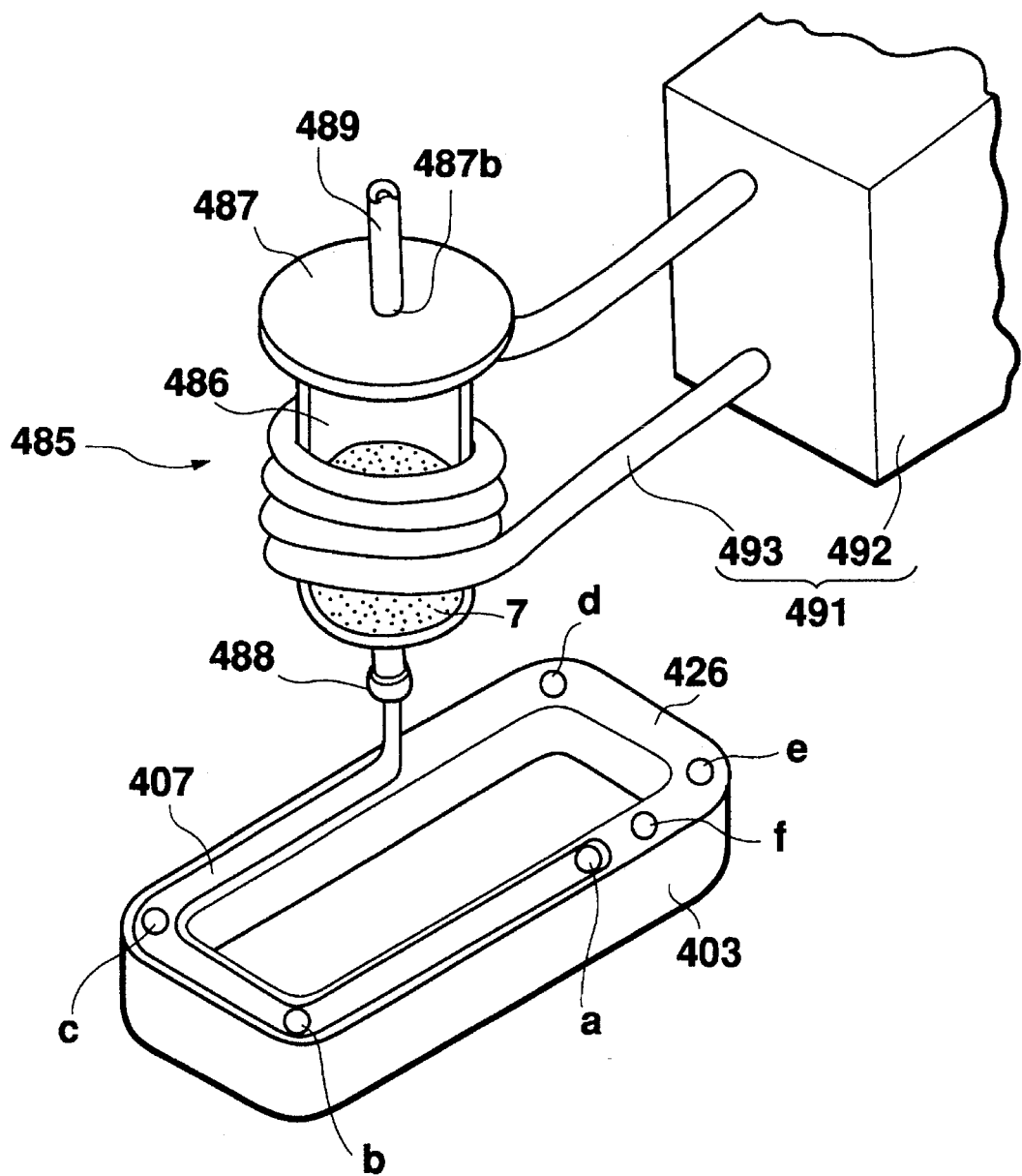
FIG. 18 shows a dispenser which applies Glass paste having a low melting point onto the end surface of the cap.

Then, on the chamfered end surface 426, glass paste 407 is applied using a dispenser, which comprises a syringe 485 and a controller (not shown), as is shown in FIG. 18. The syringe 485 is controlled to be movable in the lateral direction over the cap 403 with the end surface facing upward. The syringe 485 includes a syringe body 486, a pipe-like needle 488, and a cap 487 having an air pipe 489 in the hole 487b.

Glass paste 407 is injected into the syringe body 486. A temperature controller 491 comprises a chiller 492 and a circular pipe 493 which is wound around the syringe body 486. The temperature controller 491 performs heat exchange between the dispenser 485 and the chiller 492 via the circular pipe 493 in order to maintain the temperature of the glass paste 407 having a low melting point contained in the syringe body 486.

Figure 19:
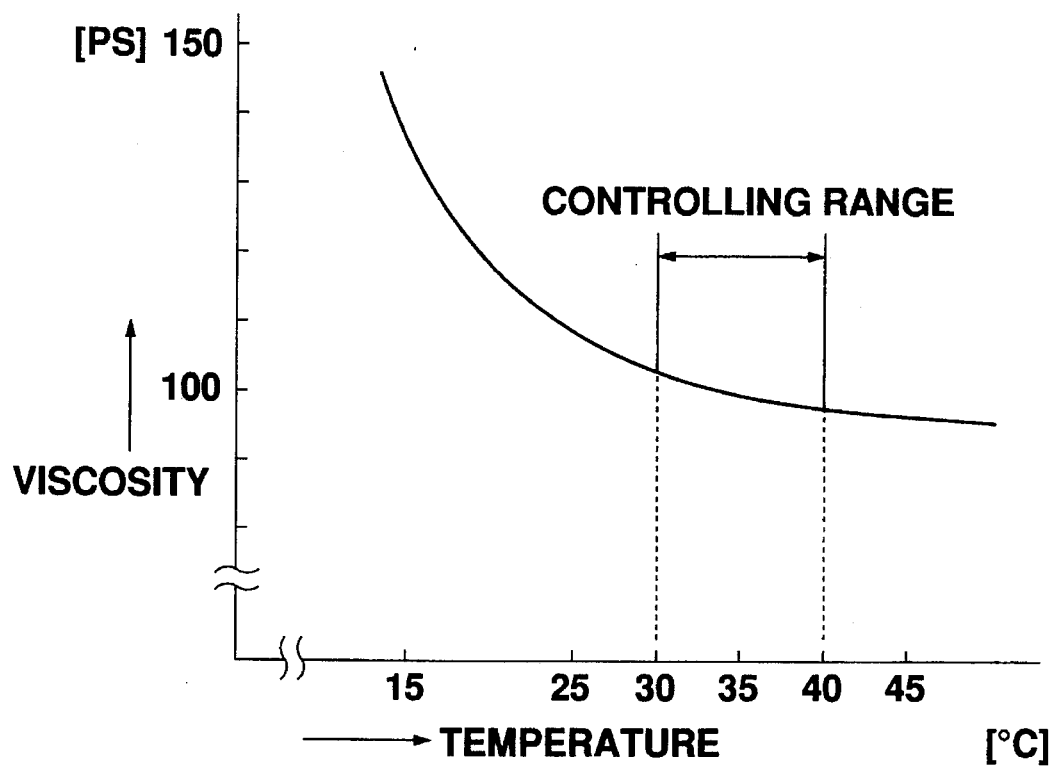
FIG. 19 is a chart showing a relationship between the temperature and viscosity of the glass paste.

The relationship between the viscosity and the temperature of the glass paste 407 is shown in FIG. 19. In the range of 30°–40° C., the viscosity of the glass 407 is 98 to 105 poise (ps) which is suitable for binding. By controlling the temperature of the glass paste 407 at 30°–40 ° C. by using the temperature controller 491, the viscosity of the glass 407 is maintained substantially constant even with the change of the room temperature, which results in a constant ejecting speed.

The reasons why the temperature of 30°–40° C. is suitable are as follows. (1) At a temperature higher than 40° C., the viscosity of the glass paste becomes lower with temporary stability. However, it is apt to cause separation of the glass powder and the binder, and therefore, agitation must be repeated for uniformity of the glass paste 407, which reduces mass-productivity. (2) At a temperature lower than 30° C., the control of the glass paste temperature is carried out near the room temperature with little difference between the room temperature and the controlled temperature. In such a case, the temperature of the glass paste is easily affected by the room temperature. At the same time, the viscosity becomes high, which requires a higher pressure for the application of the glass paste and causes unstable ejecting.

In the embodiment, the temperature of glass paste 407 is maintained at about 35° C. (The viscosity is about 100 ps) to carry out uniform application of the glass paste with a thickness being within a preferred range. The syringe 486, which is attached to a translating device (not shown), is moved so that the tip of the needle 488 faces to, and moves along, the end surface 426. During this operation, air is supplied into the syringe 486 through the air pipe 489 to increase the air pressure. The glass paste is ejected from the tip of the needle 488 and is applied on the whole length of the end surface 426 of the cap 403. For example, the ejection is started at the point "a" (see FIG. 18), and is continued along the end surface 426 passing through points "b", "c", "d", "e" and "f". When the syringe 485 returns to the initial point "a", the ejection is terminated. More particularly, the ejection of the glass paste 407 is stopped by reducing the air pressure inside the syringe 486 at the point "f" which is located immediately before the initial point "a", while keeping the syringe moving toward the point "a". In this manner, overlap of the glass paste 407 at the point "a" is prevented to achieve uniform application.

In this example, the syringe 485 is moved with the cap 403 being fixed. However, the reverse is also available. That is, the cap 403 may be moved while fixing the syringe 485, or alternatively, combination of movement of the cap 403 and the syringe 485 may be used.

In the preliminary sintering process (S5), the cap 403 having the glass paste on its end surface 426 is heated at about 365° C. to remove the binder, and is solidified after degassing.

In the step S6, the piezoelectric oscillating reed 402 is fixed by conductive adhesive 416 to the substrate 401, as is shown in FIG. 14, so that the lead electrode 413 is connected to the lead electrode 415 of the substrate 401.

In the sealing process (S7), the cap 403, which has been subjected to the preliminary sintering, is placed onto the substrate 401 having the oscillating reed 402 so that the protecting layer 419 on the substrate meets the end surface 426 of the cap 403 with the glass of low melting point 407 therebetween. The thus arranged oscillator is heated at about 380° C. in the vacuum or gas atmosphere to melt the glass 407 for the sealing of the cap 403 and the substrate 401. Because of the chamfered portion 431 and the equal width of the end surface 426, as well as the uniform application of the sealing glass paste 407, the sealing glass 407 is uniformly spread and effectively held between the cap 403 and the substrate 401 without lack or overflow of the glass paste, which results in a superior binding effect of the container without adversely affecting the appearance.

Figure 20:
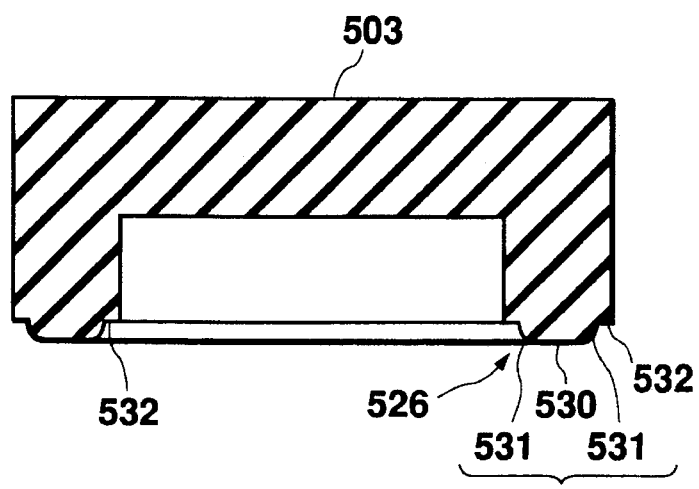
FIG. 20 shows still another example of the cap.

FIG. 20 cross-sectionally shows still another modification of the cap. The cap 503 is also manufactured by compressing ceramic powder by using a forming die, which is the same process as step S1. However, the chamfered portion of the end surface of the cap is also formed during this step. The shape of the end surface 526 is slightly changed. Namely, the end surface 526 has a flat portion 530, chamfered portions 531 and a shoulder portion 532. Only the flat portion 530 and the chamfered portion 531 contribute to the binding between the cap 530 and the substrate. The width of the flat portion 530 as well as the width of the chamfered portion 531 are equal at any portion of the end surface 526. The thus fabricated cap 503 is sintered similarly to the step S2. The barrel-grinding (i.e. chamfering) process is omitted.

It should be noted that many other changes and modifications are apparent to those skilled in the art, without departing from the principle and the scope of the invention which is defined by the appended claims.

What is claimed is:

1. A piezoelectric oscillator comprising a piezoelectric oscillating reed, a rectangular insulating substrate having long and short sides retaining the piezoelectric oscillating reed, and a cap bound to the top surface of the insulating substrate for enclosing the piezoelectric oscillating reed, wherein at least four connecting electrodes, which are divided into first and second groups, are formed on the insulating substrate for electrical connection with the piezoelectric oscillating reed, connecting electrodes included in the same group being connected to each other via metal interconnects formed on the insulating substrate, and wherein said connecting electrodes are coplanar and positioned so as to form a rectangle and at least one connecting electrode from said first group and at least one connecting electrode from said second group are positioned along a short side of said rectangular insulating substrate.

2. A piezoelectric oscillator according to claim 1, wherein said metal interconnects for the interconnection of the connecting electrodes in the same group are formed on the substrate so as not to overlap each other.

3. A piezoelectric oscillator according to claim 2, wherein at least two external electrodes are provided on the bottom surface of said insulating substrate and wherein said external electrodes positioned along a short side of the substrate are in the first group and said external electrodes positioned along the other short side of the substrate are in the second group.

4. A piezoelectric oscillator according to claim 3, wherein the connecting electrodes located in the same longitudinal side are included in the same group.

5. A piezoelectric oscillator according to claim 3, wherein at least two external electrodes are provided on the bottom surface of the insulating substrate, to each of which the metal interconnects for each group are connected through a side surface of the insulating substrate.

6. A piezoelectric oscillator according to claim 5, wherein the number of the external electrodes is two and each of the external electrodes is formed along the respective short side of the insulating substrate.

7. A piezoelectric oscillator according to claim 5, wherein the number of the external electrodes is four, and two of them are located along each of the longitudinal sides of the insulating substrate in the vicinity of the corners.

8. A piezoelectric oscillator according to claim 7, wherein two external electrodes near one short side are connected to a group of connecting electrodes and the other two external electrodes near the other shorter side are connected to the other group of connecting electrodes.

9. A piezoelectric oscillator according to claim 4, wherein said connecting electrodes, as well as the metal interconnects, are formed on the insulating substrate in point symmetry about the center point.

10. A piezoelectric oscillator according to claim 9, wherein said connecting electrodes are formed in line symmetry about the longitudinal center line on the insulating substrate.

11. A piezoelectric oscillator according to claim 10, wherein the two connecting electrodes formed along each of the shorter sides of the insulating substrate are opposed to each other with a separation groove between them.

12. A piezoelectric oscillator according to claim 1, wherein said cap is fixed onto the top surface of the insulating substrate by an adhesive.

13. A piezoelectric oscillator according to claim 12, wherein said cap has side walls with an end surface which is chamfered and is to be fixed onto the periphery of the insulating substrate.

14. A piezoelectric oscillator according to claim 12, wherein said cap has side walls having an end surface which is to be fixed onto the periphery of the insulating substrate, and the width of the end surface of the side walls is equal over the full length of the side walls.

15. A piezoelectric oscillator according to claim 14, said end surface of the side walls is chamfered.

16. A piezoelectric oscillator according to claim 15, wherein both the inner and outer edges of the end surface of the side walls are chamfered with the same radius of curvature.

17. A piezoelectric oscillator according to claim 15, wherein a protecting layer made of insulating material is formed on the top surface of the insulating substrate to which the cap is fixed.

18. A piezoelectric oscillator according to claim 17, wherein said protecting layer covers a portion of the top surface of the insulating substrate, which area size is larger than that of the end surface of the cap.

19. A piezoelectric oscillator according to claim 15, wherein said cap is fabricated by powder molding.

20. A piezoelectric oscillator according to claim 1, wherein said piezoelectric oscillating reed contains two reed electrodes located on a single end portion of the piezoelectric oscillating reed.

* * * * *